United States Patent [19]

Hodsdon et al.

[11] Patent Number: 4,642,735
[45] Date of Patent: Feb. 10, 1987

[54] FREQUENCY SYNTHESIZER MODULE

[75] Inventors: Roy F. Hodsdon; Robert K. Bell, both of Lynchburg, Va.

[73] Assignee: General Electric Company, Lynchburg, Va.

[21] Appl. No.: 583,732

[22] Filed: Feb. 27, 1984

[51] Int. Cl.⁴ ............................................. H05K 9/00
[52] U.S. Cl. .................................. 361/424; 174/35 R; 361/394; 361/399
[58] Field of Search ............. 174/35 R, 394; 361/395, 361/386, 399, 412, 413, 422, 424

[56] References Cited

U.S. PATENT DOCUMENTS

| | | | |
|---|---|---|---|
| 2,902,630 | 9/1959 | Heazel, Jr. et al. | 361/392 |
| 3,028,573 | 4/1962 | Stoehr | 339/17 |
| 3,069,598 | 12/1962 | Daily et al. | 361/415 |
| 3,395,318 | 7/1968 | Laermer et al. | 361/386 |
| 3,409,805 | 11/1968 | Whipple et al. | 361/412 |
| 3,443,161 | 5/1969 | King | 361/415 |
| 3,549,949 | 12/1970 | Granberry | 361/381 |
| 3,555,168 | 1/1971 | Frykberg | 174/35 |
| 3,571,771 | 3/1971 | Stephanson | 335/278 |
| 3,586,753 | 6/1971 | Smith | 174/50 |
| 3,721,746 | 3/1973 | Knappenberger | 174/35 MS |
| 3,816,911 | 6/1974 | Knappenberger | 29/626 |
| 3,987,344 | 10/1976 | Ambruoso, Sr. et al. | 361/388 |
| 4,004,194 | 1/1977 | Doerflinger et al. | 361/389 |
| 4,015,070 | 3/1977 | Theurer | 174/52 R |
| 4,218,578 | 8/1980 | Olschewski et al. | 174/35 R |
| 4,313,025 | 1/1982 | Grube, Jr. | 174/50 |
| 4,322,702 | 3/1982 | Bosch | 335/202 |
| 4,370,515 | 1/1983 | Donaldson | 174/35 R |
| 4,370,700 | 1/1983 | Duddles et al. | 361/399 |
| 4,388,672 | 6/1983 | Skill | 361/412 |

FOREIGN PATENT DOCUMENTS 2629053 1/1978 Fed. Rep. of Germany ...... 361/399

Primary Examiner—A. D. Pellinen
Assistant Examiner—Gregory D. Thompson
Attorney, Agent, or Firm—Nixon & Vanderhye

[57] ABSTRACT

A two piece zinc die-cast housing and cover assembly includes an internal center wall structure which divides the included space into two electromagnetically isolated cavities. A VCO circuit sub-assembly and a PLL circuit sub-assembly are each removably affixed to respective opposite sides of the center wall while each is electrically interconnected to the other directly through at least one aperture provided in the center wall. A one piece molded plastic header is removably affixed to the assembly so as to close the remaining side of the electromagnetically isolated cavity and includes apertures through which electrical leads extend from the circuit sub-assemblies for self-aligning connection to sockets or other external electrical connectors. An additional internal metallic shield directly affixed to the VCO sub-assembly as well as other features cooperate to provide an overall improved frequency synthesizer module of this general type.

19 Claims, 6 Drawing Figures

FREQUENCY SYNTHESIZER MODULE

BACKGROUND OF THE INVENTION

This invention is generally directed to frequency synthesizer modules of the type which conventionally include interconnected signal controlled oscillator (e.g. a VCO) and phase locked loop (PLL) circuit sub-assemblies. Although such sub-assemblies must be electrically connected at some points in the circuit (in accordance with well known and conventional principles), it is desirable for other reasons to maintain electrical isolation otherwise between these two circuit sub-assemblies. At the same time, the frequency synthesizer module must be mechanically robust yet easily disassembled for troubleshooting and/or servicing purposes.

Although there is a considerable body of prior art related to the electrical and physical mounting of circuit sub-assemblies as well as their electrical isolation and interconnection, there has in the past been a continuing need for an improved arrangement of physical and electrical interconnections and shielding in frequency synthesizer modules using VCO and PLL sub-assemblies and designed, for example, for use in mobile radios or the like where the arrangement needs to be especially robust and serviceable.

As those in the art will appreciate, the use of conductive walls to electrically shield one circuit sub-assembly from another is well established. It is also known to use low temperature solder so as to electrically/mechanically attach a given circuit module in a manner which permits its later removal for servicing and replacement without disturbing the higher temperature solder connections or other heat sensitive features of the circuit sub-assembly. It has also been known in the prior art to combine two or more circuit sub-assemblies inside a common shield arrangement with interconnections between the sub-assemblies being made with clips, wires, etc. Although connections between circuit sub-assemblies may also have been made in the prior art through apertures in metal walls, it is not believed that such interconnections have been made through a common shield wall to which both sub-assemblies are also physically affixed.

As a non-exhaustive representative sampling of possibly relevant prior art, reference may be had to the following collection of prior issued U.S. patents:

U.S. Pat. No. 3,028,573—Stoehr (1962)
U.S. Pat. No. 3,069,598—Daily et al (1962)
U.S. Pat. No. 3,443,161—King (1969)
U.S. Pat. No. 3,549,949—Granberry (1970)
U.S. Pat. No. 3,555,168—Frykberg (1971)
U.S. Pat. No. 3,571,771—Stephanson (1971)
U.S. Pat. No. 3,586,753—Smith (1971)
U.S. Pat. No. 3,721,746—Knappenberger (1973)
U.S. Pat. No. 3,816,911—Knappenberger (1974)
U.S. Pat. No. 3,987,344—Ambruoso, Sr. et al (1976)
U.S. Pat. No. 4,004,194—Doerflinger et al (1977)
U.S. Pat. No. 4,015,070—Theurer (1977)
U.S. Pat. No. 4,218,578—Olschewski et al (1980)
U.S. Pat. No. 4,313,025—Grube, Jr. (1982)
U.S. Pat. No. 4,322,702—Bosch (1982)
U.S. Pat. No. 4,370,515—Donaldson (1983)
U.S. Pat. No. 4,388,672—Skill (1983)
U.S. Pat. No. 4,393,436—Sugiura et al (1983)

Both Daily et al and King teach modular electronic circuits wherein multiple sub-assemblies are utilized and interconnected. Knappenberger '746 and Knappenberger '911 also reveal interconnections between sub-assemblies through metallic walls while Granberry and Stoehr reveal similar interconnections passing through insulating walls. Smith uses a one piece molded plastic header or retaining structure through which electrical connections may be made at one side of an isolated metallic cavity. Grube, Jr. teaches a unitary die-cast assembly for isolating and housing electrical radio circuits and Skill teaches a radio printed circuit board assembly where circuit sub-assemblies are interconnected through apertures in the insulating printed circuit board structure. Frykberg illustrates an electronic circuit housing which is divided into plural electrically isolated cavities. Stephanson teaches a two piece housing assembly. Ambruoso, Sr. et al teach a plug-in type of electronic module device for mobile radio equipment. Doerflinger et al teach a housing for electrical circuit sub-assemblies which includes electrically isolated compartments. Theurer also teaches an electrically shielded compartment for mounting an electrical circuit. Olschewski et al teach a two pieces r.f. shield having a gap between its two parts. Bosch teaches a two piece housing structure. Donaldson teaches a plural compartment electrically shielded structure for use with a printed circuit board. Sugiura et al also show a housing for electronic sub-assemblies which has multiple electrically isolated chambers formed by metallic walls in the housing assembly.

Unfortunately, none of such prior art structures have been found to provide an ideal mechanical/electrical environment for frequency synthesizer modules using VCO and PLL sub-assemblies and suitable for use in mobile radio equipment.

SUMMARY OF THE INVENTION

Now, however, we have discovered a new type of frequency synthesizer module which collectively provides a considerable improvement over prior art approaches.

In the presently preferred exemplary embodiment, our new frequency synthesizer module includes a two piece die-cast removably affixed metallic housing and cover assembly which includes an internal wall dividing the included space into two electromagnetically isolated cavities. The controlled oscillator circuit sub-assembly (e.g. a thick film ceramic substrate VCO) and a phase locked loop circuit sub-assembly (e.g. a thick film ceramic substrate PLL) are each removably affixed to respective opposite sides of the internal wall thus placing them in individual electrically isolated cavities. At the same time, the necessary electrical interconnections between these two sub-assemblies are made directly through apertures provided in the common center mounting wall. Preferably, one of the sub-assemblies is affixed with a low temperature solder while the other is affixed with a rubber silicon based adhesive (e.g. RTV fluid adhesive sold by General Electric) which may be cut away to release the adhered substrate. In this manner, the sub-assemblies may be conveniently removed for servicing/replacement purposes.

Our presently preferred exemplary embodiment also includes a one piece molded plastic header which is affixed to the remaining side of the housing opposite the cover (which has a generally U-shaped cross-section). The plastic header has apertures through which electrical leads may extend outwardly from the sub-assemblies for self-aligning electrical connections to sockets or otherwise.

Our presently preferred exemplary embodiment also includes a separate "secondary" metallic shield disposed over selected especially sensitive portions (e.g. microstrip transmission lines and an associated tuning capacitor) of the VCO sub-assembly and directly affixed to the ceramic substrate of the VCO. By this technique, these extra sensitive portions of the circuitry are effectively isolated from possible changes in capacitive coupling to the outer cover—even if the walls of the outer cover might be mechanically changed in relative position with respect to the circuit sub-assemblies contained within the module. Furthermore, should, for some reason, the circuit sub-assembly itself be caused to move with respect to the housing, this separate secondary metallic shield will automatically also move with the sub-assembly thus retaining a constant substantially fixed degree of capacitive coupling to the substrate under a variety of adverse conditions.

The presently preferred exemplary embodiment of our invention also includes a pair of integral mounting brackets as part of the die-cast housing each one of each extends generally parallel to the center wall while being located between respective lower inside corners of the end walls of the housing. These mounting brackets receive and mount the plastic header structure as well as the die-cast U-shaped cover while also tending to provide further rigidity to the one piece die-cast housing structure of which the mounting brackets are but a part. Preferably, the lower edge of the internal center wall stops just above a substantial portion of the mounting brackets so as to permit easy assembly of the plastic header into the space thus located under the center wall while yet leaving outer tab mounting portions of the plastic header disposed above and upon portions of the die-cast mounting brackets in the housing structure.

This novel arrangement permits complete disassembly of the module insofar as possibly repairable parts are concerned. At the same time, it provides electrical shielding of both circuit sub-assemblies from the outside environment as well as from each other. The center wall not only provides a surface for physically mounting both circuit sub-assemblies in a minimum total space, it also permits short desirably low inductance electrical interconnections between the circuit sub-assemblies directly through apertures provided in the center die-cast wall. As should now be appreciated, such interconnections are also completely shielded from the outside environment.

At the same time, the microstrip transmission line and tuning capacitor components of the VCO are doubly shielded so as to ensure relatively constant capacitive coupling from these extra sensitive circuits to the grounded shielding structure.

Simultaneously with all of the above advantages, this new arrangement provides an extremely low weight, extremely rigid zinc die-casting housing/cover assembly with removable screw interconnections and which module may also be screw connected to an underlying printed circuit board or the like while the plug-in connector leads extending through the plastic header may be permitted to achieve self alignment with compatible socket connectors in the printed circuit board.

BRIEF DESCRIPTION OF THE DRAWINGS

These as well as other objects and advantages of this invention will be more completely appreciated by a careful reading of the following detailed description of the presently preferred exemplary embodiment of this invention taken in conjunction with the accompanying drawings, of which.

DESCRIPTION OF THE PREFERRED EMBODIMENT

Figure 1:
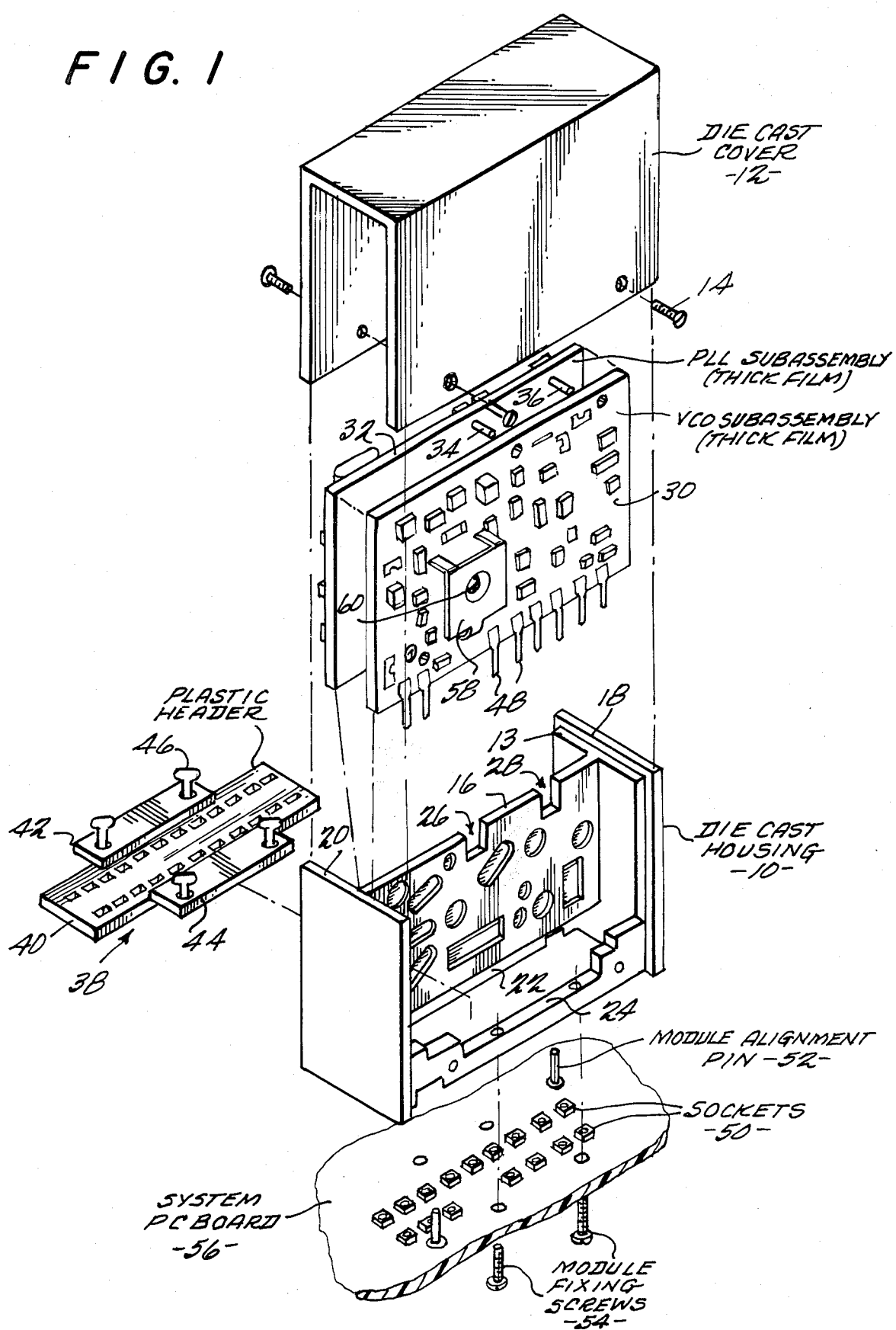
FIG. 1 is an exploded perspective view of the various components which make up an exemplary embodiment of the frequency synthesizer module of this invention.
Figure 2:
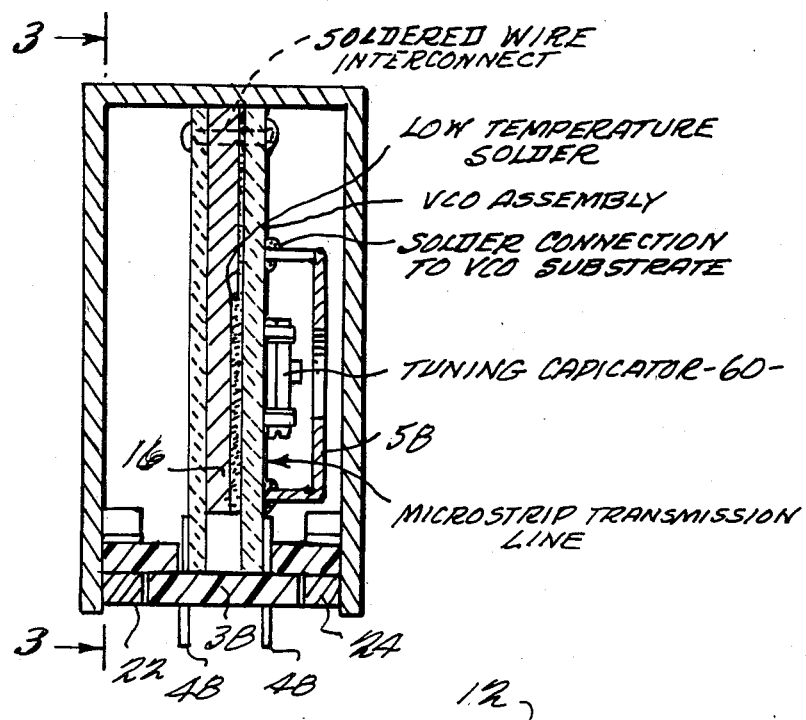
FIG. 2 is a cross-sectional view through the narrow dimension of an assembled module in accordance with FIG. 1.
Figure 3:
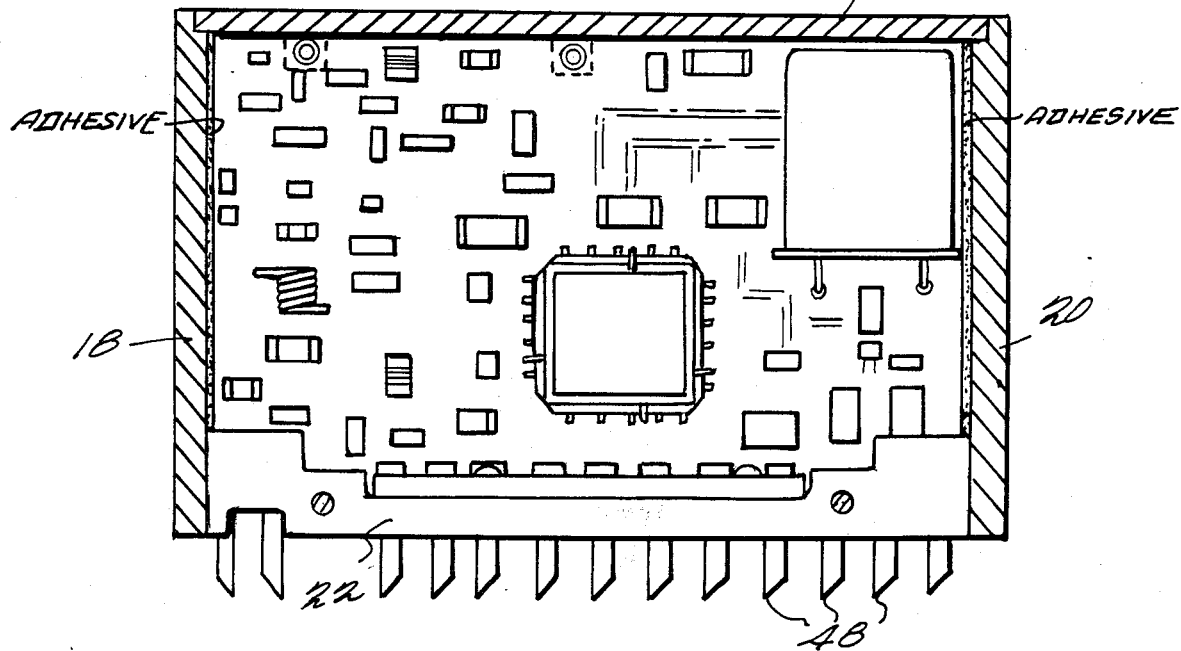
FIG. 3 is a cross-sectional view through the long dimension of an assembled module at line 3—3 in accordance with FIG. 1.
Figure 4:
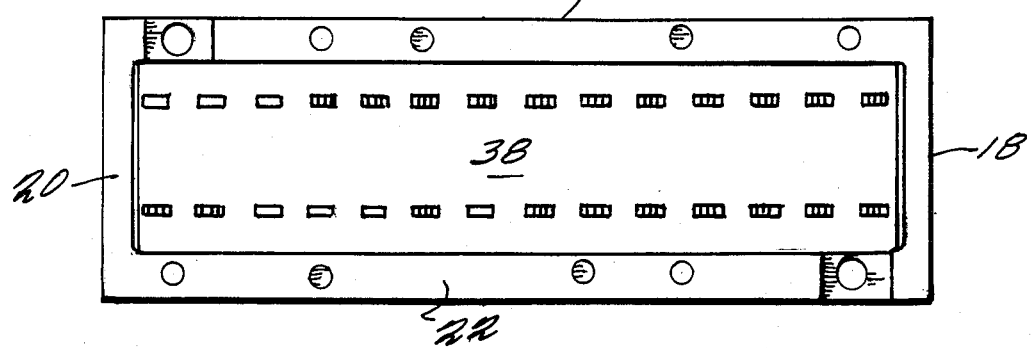
FIG. 4 is a view of the module from the bottom as depicted in FIGS. 2 and 3.

The presently preferred exemplary embodiment of the frequency synthesizer module shown in FIGS. 1–6 uses a zinc die-cast housing 10 and a zinc die-cast cover 12. This two piece assembly fits together, as shown, along the integral shoulders 13 and may be removably screw connected as at 14 to provide an included metallically shielded electrically isolated space. As shown in the figures, this internal shielded space is divided into two mutually isolated cavities by a central inner wall 16 the housing is further defined by end walls 18, 20 and integrally formed mounting brackets 22, 24 extending between the lower inside corners of the end walls 18, 20. It will be noted that the center wall 16 includes apertures 26, 28 through which electrical interconnections may be made between the separate isolated cavities.

The VCO sub-assembly 30 and the PLL sub-assembly 32 may be of conventional thick film, ceramic substrate circuit design and are thus not described in further detail. As will be appreciated, the VCO typically includes higher frequency, higher power circuits than the relatively lower level audio/digital signals typically found in the PLL. Although these two types of circuits may be divided in differing ways, the result is typically two separate substrates having different types of possibly interfering signals and which are therefore preferably each kept in electromagnetic isolation from the other. At the same time, and as will be appreciated by those in the art, these two sub-assemblies must also be interconnected (e.g. by a dc control lead to tune the VCO and by an rf phase/frequency lead to the PLL with both VCO and PLL also having a common electrical reference or ground connection through external pins and/or through the metallic housing itself). Such necessary interconnection is very desirably made by soldered connection pins 34, 36 passing directly through apertures 26, 28. This provides a very low inductance connection directly through the center wall 16 which also serves to physically mount both the PLL and VCO sub-assemblies on its opposite sides and their respective mutually isolated compartments.

As will be appreciated from the figures, the cover 12 has a generally U-shaped cross-section and, together with the walls 16, 18 and 20 of the housing 10, physically closes all but the lower side of these electrically isolated cavities. The lower side of the module is physically and environmentally completed by the plastic header 38. It includes a central portion 40 having two sets or rows of aligned apertures and outer tabs or mounting portions 42, 44. When assembled into place under the center wall 16, the mounting tabs 42, 44 lie on top of the mounting brackets 22, 24 with aligned mounting holes (not shown) through which the drive pins 46 pass to secure the plastic header to the mounting brackets of the die-cast housing 10. As should now also be appreciated, the electrical pins or leads 48 from the circuit sub-assemblies may pass through respectively aligned ones of the apertures in the plastic header 38 for self-aligning interconnection to the sockets 50 or for otherwise externally interconnecting with other circuit elements of the system in which the module is to be used.

As depicted in FIG. 1, the mounting brackets 22, 24 may include aligning apertures into which alignment pins 52 may pass to assist in registering the pins 48 with sockets 50. Furthermore, the mounting brackets 22, 24 may conveniently include threaded mounting holes into which module fixing screws 54 may be screwed from the other side of the system PC board 56 so as to more securely fix the module to the system printed circuit board.

In the presently preferred exemplary embodiment, the VCO sub-assembly is attached to the center wall 16 by low temperature solder while the PLL sub-assembly is disposed on the other side of the center wall by a rubber silicon based adhesive (e.g. the RTV based cement marketed by General Electric). As shown, a vertical bead of such adhesive down each side of the PLL module adheres to the end walls 18, 20 and thus fixes it in position adjacent the center wall 16. In this way, the sub-assemblies may be easily removed for servicing/replacement. For example, the adhesive can be cut and the two leads 34, 36 de-soldered from the PLL substrate so as to free it and permit removal. Thereafter, the housing can be heated sufficiently to soften the low temperature solder located between the VCO substrate and center wall 16 thus freeing the VCO for removal as well.

Figure 5:
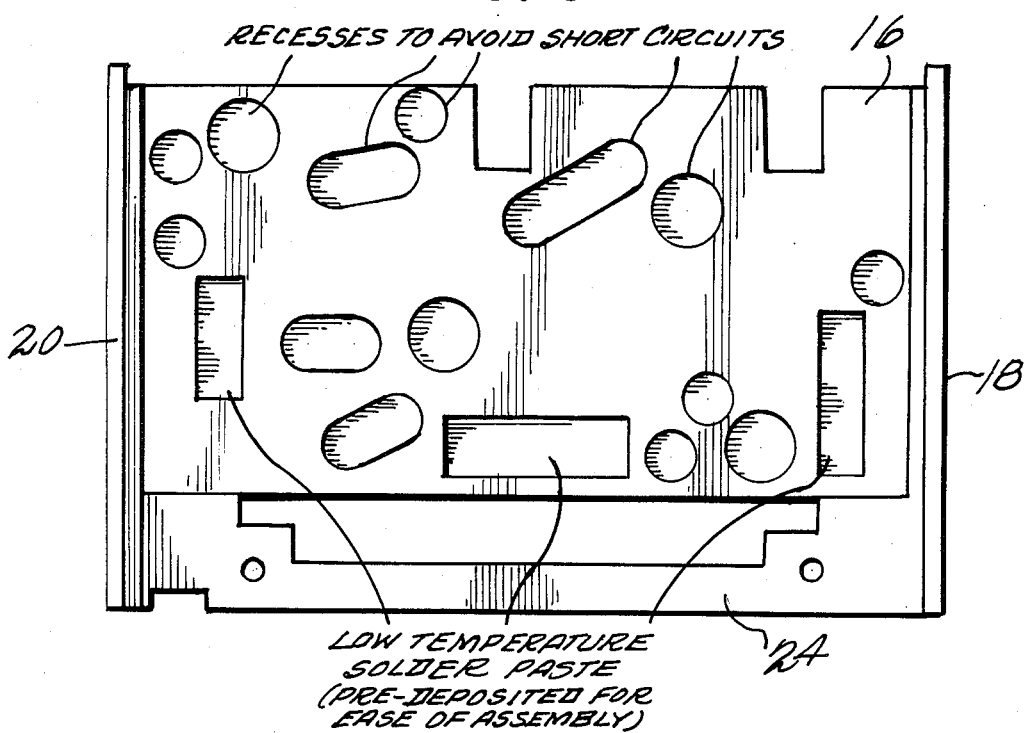
FIG. 5 is a side view of the unassembled zinc die-cast housing portion of the module shown in FIG. 1 showing recessed cavities in the side of the center wall to which the VCO sub-assembly is attached.
Figure 6:
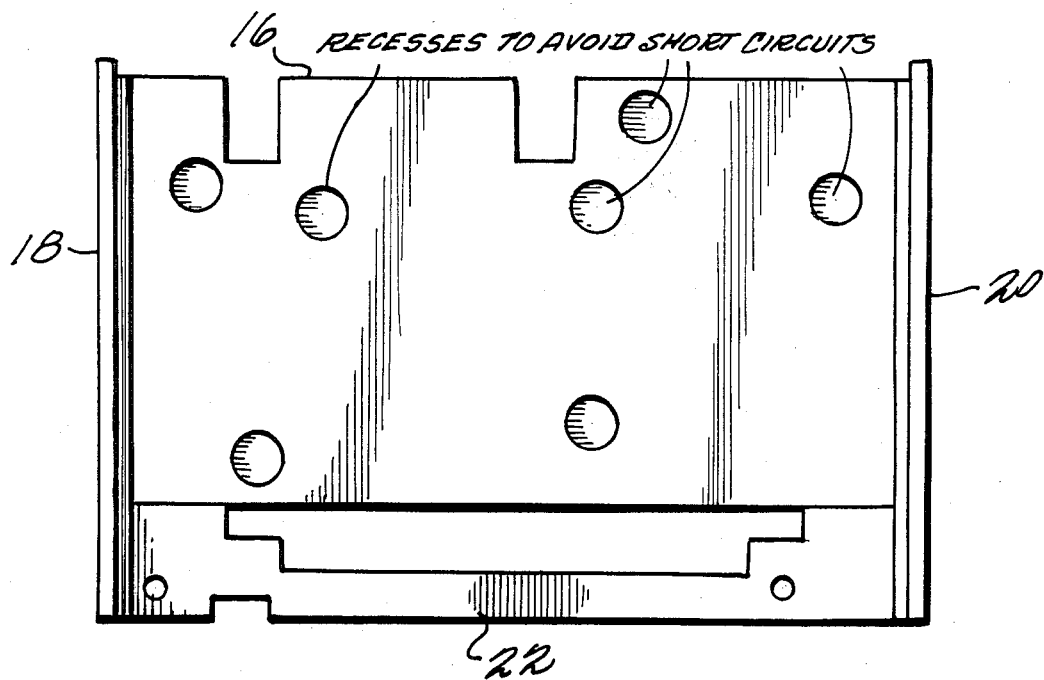
FIG. 6 is a side view similar to that of FIG. 5 but of the opposite side of the center wall showing recessed cavities provided therein on the side which receives the PLL sub-assembly.

A special secondary metal shield 58 is also employed in the preferred embodiment. It shields portions of the VCO sub-assembly which are especially sensitive to variations in capacitive coupling to the outer cover shield (e.g. such as microstrip transmission line and/or a tuning capacitor). Since it is soldered directly to the ceramic substrate of the VCO sub-assembly, it acts to substantially prevent capacitive coupling between such sensitive portions of the VCO circuitry and the outer cover shield (i.e. the outer wall formed by the die-cast cover 12). This additional secondary metal shield may possibly be thought of as a form of strip line. In any event, it is electrically and physically attached by three soldered legs directly to grounded portions of the VCO substrate and thus positioned over the sensitive tuning capacitor and microstrip line. This arrangement thus acts to reduce acoustic modulation of the VCO which might otherwise occur in response to fluctuations of the outer shield (die-cast cover 12) due to vibration and shock. A small hole in the secondary metal shield 58 permits tuning adjustment of the tuning capacitor 60 without substantially lessening desired shielding effect. The recesses with rounded corners shown in the center wall at FIGS. 5 and 6 are disposed to underlie any conductive "through-holes" of the VCO and PLL substrates which might otherwise be undesirably shorted to the grounded center shield wall 16. The square cornered recesses shown in FIG. 5 are partially pre-filled with a low temperature paste solder to facilitate assembly of the VCO substrate thereto.

This unique compact design for a frequency synthesizer module is thus provided by a two piece zinc die-cast housing and cover assembly which provides both electrical shielding and environmental protection for the necessary VCO and PLL hybrid modules. At the same time, the die-cast cover can be easily removed so as to permit servicing of the synthesizer module. The mechanically rigid construction of the die-cast housing and the low temperature soldering of the VCO module directly to this rigid structure helps minimize microphonics which might otherwise be caused by dimensional movement between the various parts of the module assembly. The use of low temperature (e.g. indium based) solder so as to attach the VCO sub-assembly permits its easy removal from the center wall for troubleshooting without adversely affecting the normal higher temperature soldered connections found on the VCO sub-assembly itself. Similarly, the PLL sub-assembly may be removed without adversely affecting the VCO sub-assembly by simply cutting through the adhesive. The advantages (e.g. reduced acoustic modulation of the VCO that might otherwise be caused by vibration and shock induced fluctuations of the outer shield) of the secondary shield have already been discussed. The plastic header not only aligns the lead frames attached to the VCO and PLL sub-assemblies, it also permits easy insertion of the synthesizer module into a system printed wire board array of sockets or the like while simultaneously providing at least partial environmental protection. This arrangement also conveniently permits rugged screw connection of the die-cast cover and of the entire synthesizer module directly to the system printed circuit or printed wire board and also permits self alignment of the plug-in connections.

Although only one presently preferred exemplary embodiment has been described in detail above, those skilled in the art will recognize that many modifications and variations may be made in this exemplary embodiment while still retaining many of the novel advantages and features of this invention. Accordingly, all such modifications and variations are intended to be included within the scope of the following claims.

What is claimed is:

1. A frequency synthesizer module comprising:
    a two-piece metallic-die cast housing and cover assembly including a an internal metallic wall disposed between two end walls which divides the space enclosed thereby into two isolated cavities;
    a VCO circuit sub-assembly on a first substrate which is solder-affixed onto a first side of said internal metallic wall;
    a PLL circuit sub-assembly on a second substrate which is removably affixed with adhesive into position adjacent a second side of said internal metallic wall, each said circuit sub-assembly being electrically interconnected directly to the other by at least one conductor passing through at least one aperture in said internal metallic wall; and said housing includes said two end walls transverse to said internal metallic wall which is centrally disposed therebetween and wherein said housing further includes two mounting brackets, each extending generally parallel to said internal metallic wall and located between respective lower inside corners of said end walls.

2. A frequency synthesizer module comprising:
a two piece metallic die-cast housing and cover assembly including an internal metallic wall which divides the space enclosed thereby into two electromagnetically isolated cavities;
a first circuit sub-assembly on a first substrate and a second circuit sub-assembly on a second substrate each substrate being removably affixed into positions on respective opposite side of said internal metallic wall and each electrically interconnected directly to the other by at least one conductor passing through at least one aperture in said internal metallic wall;
a one-piece molded plastic header removably affixed to a side of said housing opposite said cover and said header having apertures through which electrical leads extend outwardly from said housing; and
said housing including two ends walls transverse to said internal metallic wall which is centrally disposed therebetween and wherein said housing further includes two mounting brackets, each extending generally parallel to said internal metallic wall and located between respective lower inside corners of said end walls.

3. A frequency synthesizer module as in claim 2 further comprisng a separate secondary metallic shield disposed over portions of said first substate and directly affixed thereto.

4. A frequency synthesizer module as in claim 3 wherein one of said substrates is affixed to said internal metallic wall with low temperature solder and the other of said substrates is affixed into its said position with respect to said internal wall with adhesive.

5. A frequency synthesizer module comprising:
a two piece metallic die-cast housing and cover assembly including an internal metallic wall which divides the space enclosed thereby two electromagnetically isolated cavities;
a first circuit sub-assembly on a first substrate and a second circuit and sub-assembly on a second substrate each substrate being removably affixed into positions on respective opposite sides of said internal metallic wall and each electrically interconnected directly to the other by at least one conductor passing through at least one aperture in said internal metallic wall;
a one-piece molded plastic header removably affixed to a side of said housing opposite said cover and said header having apertures through which electrical leads extends outwardly from said housing;
a separate secondary metallic shield disposed over portions of said first substrate and directly affixed thereto;
one of said substrates being affixed to said internal metallic wall with low temperature solder and the other of said substrates being affixed into its said position with respect to said internal wall with adhesive; and
said housing including two end walls transverse to said internal metallic wall which is centrally disposed therebetween and wherein said housing further includes two mounting brackets, each extending generally parallel to said internal metallic wall and located between respective lower inside corners of said end walls.

6. A frequency synthesizer module as in claim 5 wherein the lower edge of said internal metallic wall stops above a substantial portion of said mounting brackets to permit assembly of said header beneath said internal metallic wall with at least outer tab portions of said header remaining disposed above and upon portions of said mounting brackets.

7. A frequency synthesizer module comprising:
a one-piece metallic housing having a center wall disposed between two transverse end walls and having at least one aperture formed through said center wall;
a one-piece metallic cover of generally U-shaped cross-section and removably attached to said housing to fit over and enclose said center wall and inside surface of said end walls by providing top and side walls for the housing when attached thereto;
an insulating header with first and second sets of apertures formed therein, said header being affixed to said housing to provide its bottom wall;
a controlled oscillator circuit sub-assembly removably affixed into a position on one side of said center wall;
a phase-locked loop circuit sub-assembly removably affixed into a position on the opposite side of said center wall;
said circuit sub-assembly being electrically interconnected through said at least one aperture in said center wall; and
each of said circuit sub-assbmlies including conductive leads extending downwardly through a respective one of said sets of apertures in said header and cut of said housing;
said housing including transverse mounting brackets formed between lower inside corners of said end walls, said cover and said header each being removably attached to said mounting brackets.

8. A freuqnecy synthesizer module as in claim 7 wherein said controlled oscillator circuit sub-assembly is soldered to said center wall.

9. A frequency synthesizer module as in claim 7 wherein said phase-locked loop circuit sub-assembly is adhesively affixed into its said position.

10. A frequency synthesizer module as in claim 7 wherein said controlled oscillator circuit sub-assembly includes a further metallic shield disposed over a portion thereof by bent legs having distal ends soldered to a surface of this sub-assembly.

11. A frequency synthesizer module as in claim 7 wherein said housing and said cover are of zinc die-cast construction.

12. A frequency synthesizer module as in claim 7 wherein said cover is removably affixed to said mounting brackets by screws.

13. A frequency synthesizer module as in claim 12 wherein said mounting brackets also include threaded screw holes disposed downwardly to permit removable screw connection of module to an underlying circuit board structure.

14. A frequency synthesizer module as in claim 7 wherein said header is a one-piece molded plastic structure which includes a central longitudinal portion which fits between said mounting brackets and outer opposing tab portions which fit over respective ones of said mounting brackets, said mounting brackets and said tab portions each having mated mounting holes formed therein.

15. A frequency synthesizer module as in claim 14 wherein said controlled oscillator circuit sub-assembly is soldered to said center wall.

16. A frequency synthesizer module as in claim 15 wherein said mounting brackets also include threaded screw holes disposed downwardly to permit removable screw connection of said module to an underlying circuit board structure.

17. A frequency synthesizer module as in claim 15 wherein said controlled oscillator circuit sub-assembly includes a further metallic shield disposed over a portion thereof by bent legs having distal ends soldered to a surface of said controlled oscillator circuit sub-assembly.

18. A frequency synthesizer module comprising:
- a one-piece metallic housing having a center wall disposed between two transverse end walls and having at least one aperture formed through said center wall;
- a one-piece metallic cover of generally U-shaped cross-section and removably attached to said housing to fit over and enclose said center wall and inside surface of said end walls by providing top and side walls for the housing when attached thereto;
- an insualting header with first and second sets of apertures formed therein, said header being affixed to said housing to provide its bottom wall;
- said circuit sub-assemblies being electrically interconnected through said at least one aperture in said center wall; and
- each of said circuit sub-assemblies including conductive leads extending downwardly through a respective one of said sets of aperture in said header and out of said housing;
- surface of said center wall each including cavities positioned under through-holes of respective associated sub-assemblies so as to prevent electrical shorting thereof to said center wall.

19. A frequency synthesizer module comprising:
- a one-piece metallic housing having a center wall disposed between two transverse end walls and having at least one aperture formed through said center wall;
- a one-piece metallic cover of generally U-shaped cross-section and removably attached to said housing to fit over and enclose said center wall and inside surfaces of said end walls by providing top and side walls for the housing when attached thereto;
- an insulating header with first and second sets of apertures formed therein, said header being affixed to said housing to provide its bottom wall;
- a controlled oscillator circuit sub-assembly removably affixed into a position on one side of said center wall;
- a phase-locked loop circuit sub-assembly removably affixed into a position on the opposite side of said center wall;
- said circuit sub-assemblies being electrically interconnected through said at least one aperture in said center wall; and
- each of said circuit sub-assemblies including conductive leads extending downwardly through a respective one of said sets of apertures in said header and out of said housing;
- the surface of said center wall associated with said controlled oscillator circuit sub-assembly including at least one cavity containing solder for use in attaching said controlled oscillator circuit sub-assembly to said center wall.

* * * * *